United States Patent [19]
Knüttel et al.

[11] Patent Number: 5,173,661
[45] Date of Patent: Dec. 22, 1992

[54] NUCLEAR MAGNETIC RESONANCE SPECTROMETER

[75] Inventors: Bertold Knüttel, Rheinstetten-Mörsch; Wolfgang H. Müller, Karlsruhe, both of Fed. Rep. of Germany

[73] Assignee: Bruker Analytische MeBtechnik GmbH, Fed. Rep. of Germany

[21] Appl. No.: 610,373

[22] Filed: Nov. 6, 1990

[30] Foreign Application Priority Data

Nov. 8, 1989 [DE] Fed. Rep. of Germany ....... 3937150

[51] Int. Cl.$^5$ .......................................... G01R 33/20
[52] U.S. Cl. .................................... 324/309; 324/307
[58] Field of Search ................ 335/299; 324/300, 307, 324/318, 319, 320, 322

[56] References Cited

U.S. PATENT DOCUMENTS

| | | | |
|---|---|---|---|
| 3,622,869 | 11/1971 | Golay | 324/320 |
| 4,812,797 | 3/1989 | Jayakumar | 335/299 |
| 4,899,109 | 2/1990 | Tropp et al. | 324/320 |
| 4,987,371 | 1/1991 | Glover et al. | 324/320 |
| 5,006,804 | 4/1991 | Dorri et al. | 324/320 |

FOREIGN PATENT DOCUMENTS

| | | |
|---|---|---|
| 0212716 | 7/1986 | European Pat. Off. . |
| 0274773 | 11/1987 | European Pat. Off. . |
| 3511303 | 3/1985 | Fed. Rep. of Germany . |
| 87/01199 | 7/1986 | PCT Int'l Appl. . |

Primary Examiner—Michael J. Tokar
Attorney, Agent, or Firm—Walter A. Hackler

[57] ABSTRACT

A nuclear magnetic resonance spectrometer, in particular a nuclear spin tomograph serving to investigate biological samples, comprising a magnetic coil for generating a substantially homogeneous magnetic field in a volume under examination, and a set of shim coils for eliminating any remaining inhomogeneities of the magnetic field is characterized in that at least one additional electric conductor, preferably an additional shim coil, is provided which may be arranged in the volume under examination, in the direct vicinity of the sample, that the additional conductor is designed in such a way that it will generate an inhomogeneous magnetic field when loaded with current, and that it can be loaded with currents of a type generating inhomogeneous magnetic fields which will eliminate, at least partially, and in a selected area in the sample, local field inhomogeneities resulting from susceptibility variations within the sample, for example. This enables the accuracy of the spectroscopy results to be improved.

14 Claims, 9 Drawing Sheets

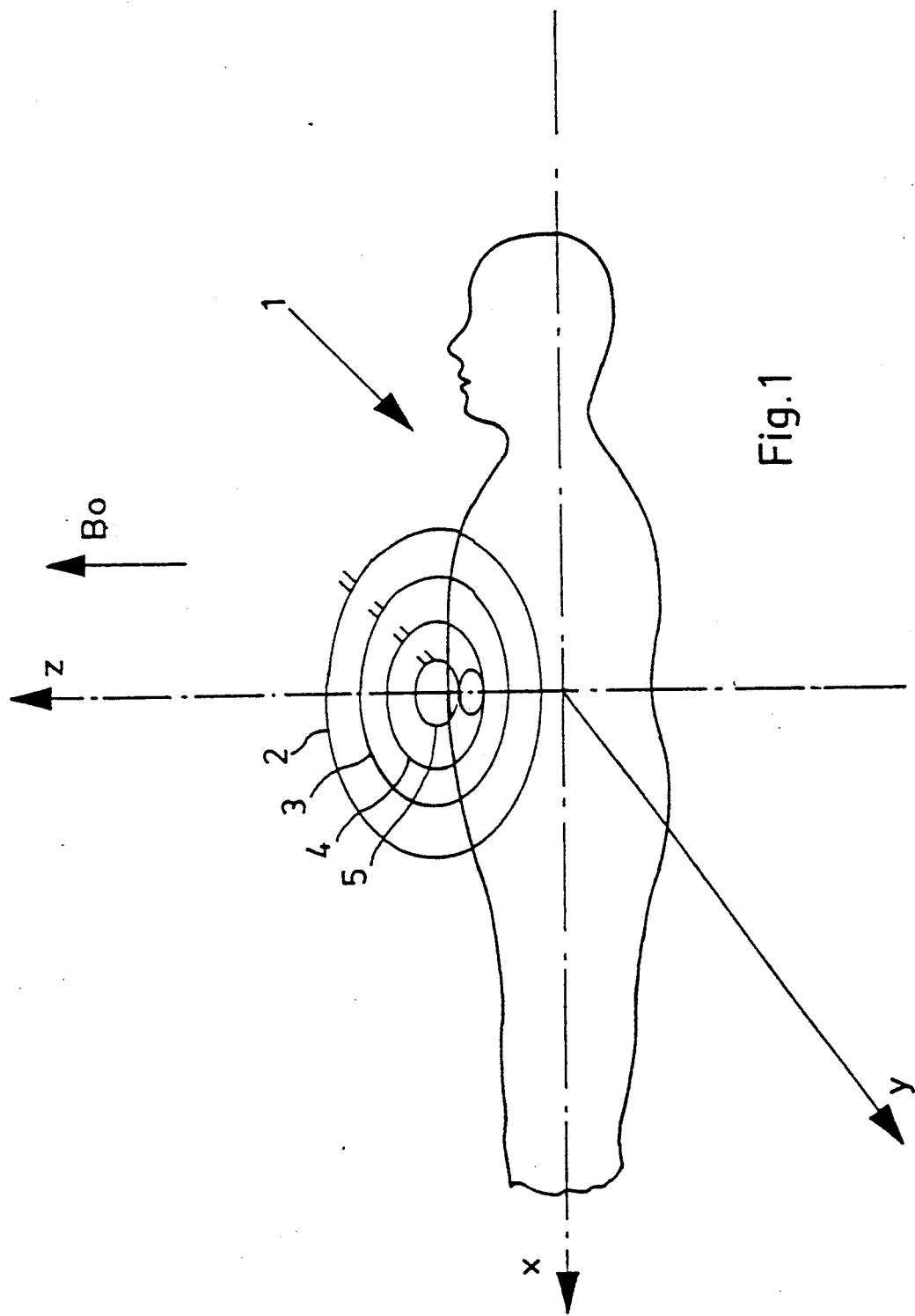

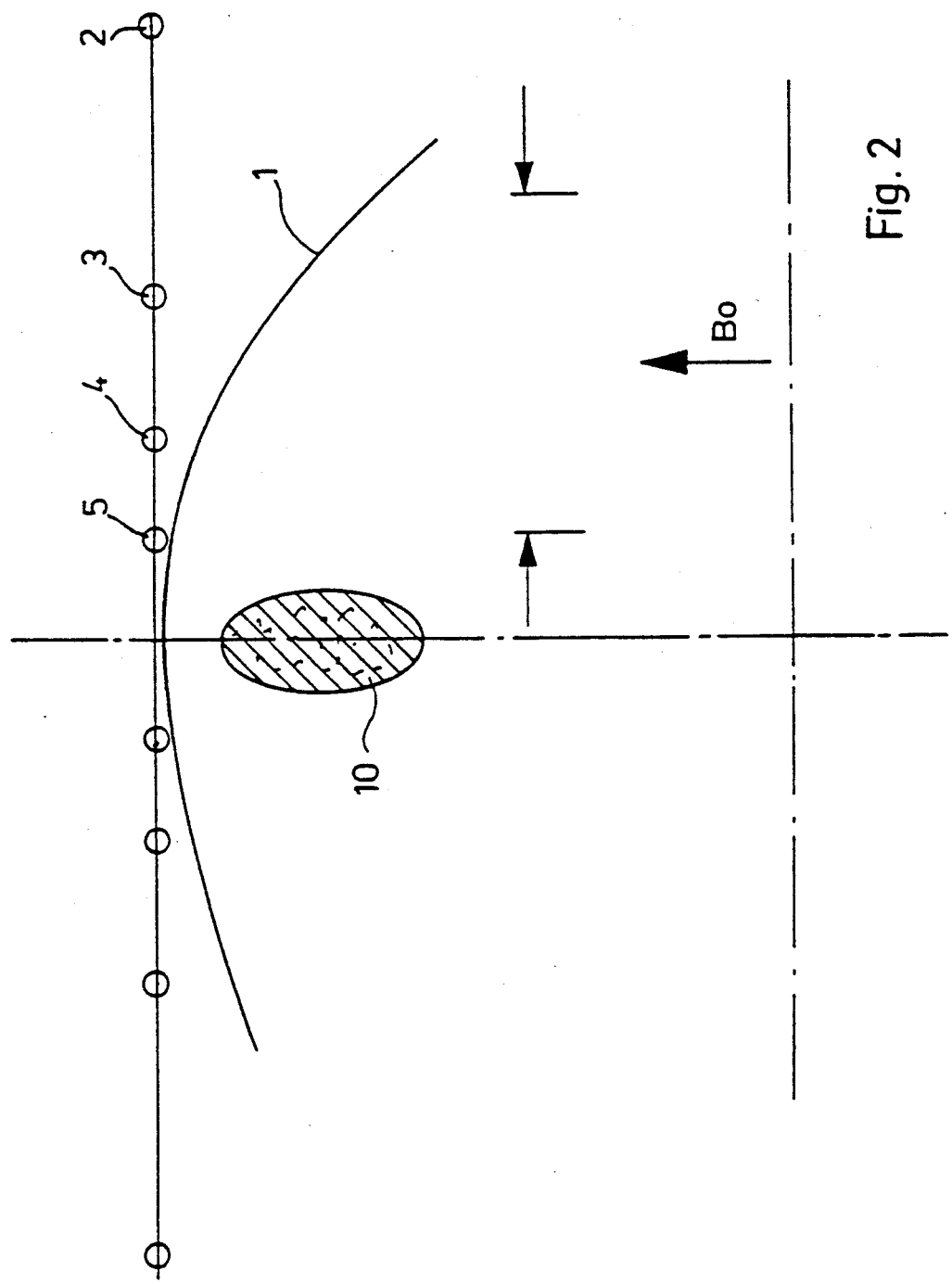

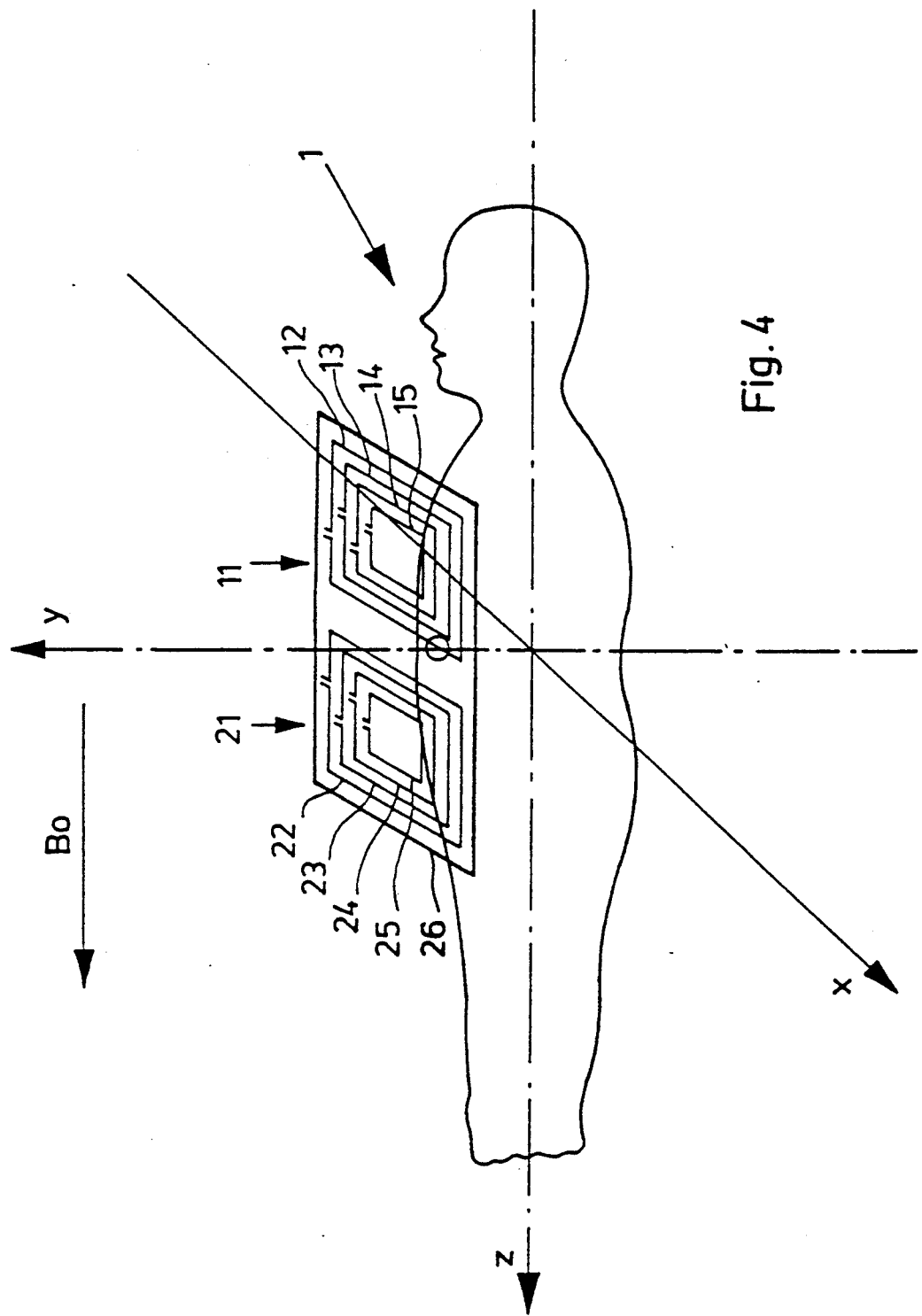

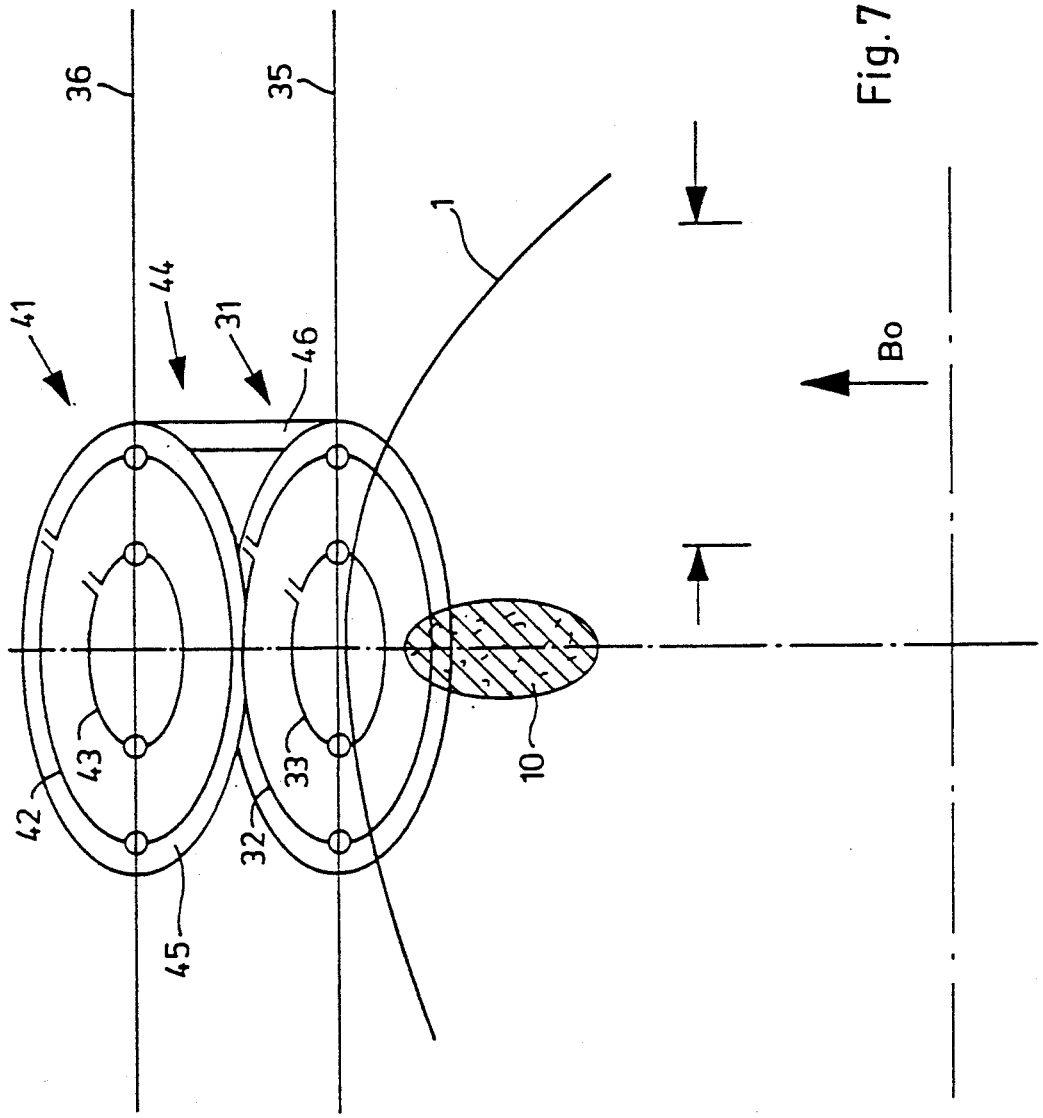

NUCLEAR MAGNETIC RESONANCE SPECTROMETER

BACKGROUND OF THE INVENTION

The present invention relates to a nuclear magnetic resonance spectrometer, in particular a nuclear spin tomograph serving to investigate biological samples, comprising a magnetic coil for generating a substantially homogeneous magnetic field in a volume under examination, and a set of shim coils for eliminating any remaining inhomogeneities of the magnetic field. When an image is to be generated, as in the case of a nuclear spin tomograph, an additional set of gradient coils are present in the volume under examination, for generating pulsed magnetic gradient fields. In addition, a nuclear magnetic resonance spectrometer comprises a sample head for transmitting and/or receiving r.f. pulses.

Nuclear magnetic resonance spectroscopy (NMR spectroscopy) in particular requires the use of extremely homogeneous magnetic fields. In the case of known nuclear magnetic resonance spectrometers one achieves this homogeneity with the aid of a corresponding design of the magnetic system and by electric corrective measures, in particular the use of shim coils. In investigating biological samples, especially in in-vivo spectroscopy, the following problem is, however, encountered: due to the magnetic susceptibility of the samples, an initially homogeneous magnetic field is distorted in such a way that it becomes impossible for local spectroscopy to be performed. Field distortions may be caused, for example, by the iron content in the liver of a patient who is to undergo examination in a nuclear spin tomograph.

Conventional shim systems are based on correcting expansion coefficients of the surface harmonics. They are arranged at the greatest possible diameter within the magnetic system with a view to generating the purest possible coefficients in order to avoid mutual interaction between different shim coils. Due to the large spacing from the object to be spectroscopized, it is not possible for local field distortions to be corrected.

SUMMARY OF THE INVENTION

Now, it is the object of the present invention to provide a possibility of eliminating, at least partially, the effects on the spectroscopy results of local field distortions, which may be due for example to the susceptibility of the sample.

The invention achieves this object by an arrangement which comprises at least one additional electric conductor, preferably an additional shim coil, which may be provided in the volume under examination, in the direct vicinity of the sample, wherein the additional conductor is designed in such a way that it will generate an inhomogeneous magnetic field when loaded with current, and wherein the said conductor can be loaded with currents of a type generating inhomogeneous magnetic fields which will eliminate, at least partially, and in a selected area in the sample, any inhomogeneities of the field resulting from susceptibility variations in the sample.

The invention makes use of electric conductors, conductor loops or coils for generating a local magnetic field, the said field-generating elements being arranged as close as possible to the volume to be homogenized. It is thus possible to correct field inhomogeneities with relatively small dimensions, compared with the volume under examination, the variation of the correction field being notably more significant at small distance than at a larger distance. Although the use of such field-generating elements may in fact give rise, at a greater distance from the volume to be homogenized, to field distortions even more significant than would be the case without such field-generating elements, this is, however, no disadvantage if the examination being carried out is intended to investigate only a patient's liver, for example.

The systems that have been known heretofore corrected only inhomogeneities that where encountered even without the presence of a sample, in any case no inhomogeneities that where due to inhomogeneities within the sample. The shim coils are always to be placed as close to the sample as possible, but they are never, not even in the case of analytical spectrometers, as close to the sample as to be capable of balancing out variations encountered in the volume under examination (due to HF sample inhomogeneities). In the case of tomographs, it is an additional aspect that the patient should be allowed to move as freely as possible in order to prevent the development of claustrophobia. It is for this reason that the shim gradient system leaves as much room as possible.

According to one embodiment of the invention, the additional conductor is mounted on a carrier for being arranged at a plurality of different positions within the volume under examination. The carrier guaranties the uniformity in shape of the conductor, and this in particular if the latter consists of a plurality of conductor loops or coils arranged in fixed positions relative to each other. The carrier may be mounted on a supporting structure permitting the carrier to assume one of a plurality of predetermined positions. The design of the supporting structure may be of a type which permits an observer to read, for example, with the aid of a sliding scale, where exactly the carrier and, thus, the electric conductor is to be found at any time.

According to a preferred embodiment, the conductor may be arranged in such a way, that it is, for example shiftable to the periphery of the sample space or outside the sample space, that it will not disturb the movement of the sample, in particular of a patient, into and out of the sample space.

The magnitude of the current flowing through the field generating elements (or through a single field-generating element) and the optimum location of the field-generating elements depend on the field distortion provoked by the sample. This field distortion can be determined in different ways, for performing the correction thereafter. So, it is possible, for example, to determine the local field configuration with the aid of a NMR method, to determine thereafter the correction currents by arithmetic means, for example according to the least square deviation method, and to repeat these procedural steps until the desired homogeneity is reached. This homogenizing process may be carried out automatically by the set-up of the nuclear magnetic resonance spectrometer. It is a precondition for the method just described that the shim coils used for correcting the local field distortions be arranged at a predetermined position or at a given position that has been selected from among a plurality of predetermined positions taken into account in the calculations.

Existing field inhomogeneities can be determined quickly, for example by nuclear spin interferography, for example with the aid of the method known as GINSENG ("Generalized Interferograph using Spin-Echoes and Gradient Echoes") (J. Hennig, Proc. 7th SMRM, San Francisco, page 697, 1988). This method makes it possible to determined very quickly the effect of the coil placed on the patient, in response to the location of the coil and its current, and to vary the location of the coil and/or its current manually in order to achieve the desired correction. It is not necessary in this case for the coil to occupy a position that can be expressed numerically. The method also can be automated.

If, during the NMR process, the gradients are varied in time, the homogenizing currents flowing in the shim coil may be disturbed by induction during switching of the gradients. This effect can be avoided according to one embodiment of the invention by an arrangement where a plurality of shim coils is arranged in the main magnet in such a way that the induction signal disappears altogether. To this end, one shim coil may be arranged in the immediate neighborhood of the sample to be examined, and another shim coil, which is electrically connected to the first shim coil, is arranged at a larger distance from the sample so that it does not influence the homogenization, but serves merely for compensating the current induced in the first mentioned shim coil.

BRIEF DESCRIPTION OF THE DRAWINGS

Other features and advantages of the invention will become apparent from the following description of certain embodiments of the invention, when read in conjunction with the claims and the drawings that show details which are essential to the invention. The different features may be used in any embodiment of the invention individually, or in any combination thereof.

In the drawings

FIG. 1 shows a simplified perspective view of the arrangement of a plurality of flat concentrical ring coils arranged in a single plane, as used for examination of a patient;

FIG. 2 shows a sectional view of the relative positions of the coils of FIG. 1, and the currents flowing therethrough;

FIG. 4 shows a simplified perspective view of the arrangement of a plurality of flat concentrical rectangular coils, arranged in a single plane, as used for examination of a patient;

FIG. 7 shows the use of pairs of ring coils which are arranged coaxially, but in several planes;

DETAILED DESCRIPTION OF THE PREFERRED EMBODIMENTS

In the example of FIG. 1, a patient lying flat is being examined with the field Bo generated by the field coil of the nuclear magnetic resonance spectrometer, corresponding as usual to the z axis of the represented coordinate system, extending perpendicularly to the patient's longitudinal axis.

For compensating an existing field distortion in the z direction, inside the patient's body, the invention makes use of a shim coil set which, in the illustrated example, consists of four ring-shaped wire loops or ring coils or shim coils 2 to 5 comprising one winding each, which are all arranged concentrically in a single plane and designed in such a way that each of the four currents in the coils can be adjusted independently. A circular ring coil generates a magnetic field along its axis which points in the direction of that axis. By varying the currents it is now possible to produce a profile of the magnetic field, outside the plane of the coil, which is approximately in opposition to a possible disturbance. In the illustrated embodiment, the direction of the field of the shim coils 2 to 5 coincides with the direction of the main magnetic field Bo, and the longitudinal direction of the patient 1, or quite generally the sample, extends perpendicularly thereto. Such a constellation is found, for example, inside a pole-shoe magnet.

Figure 3A:
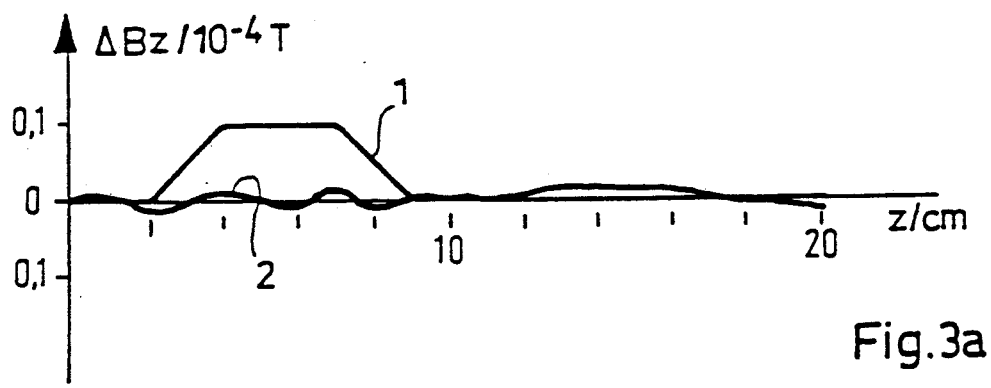
FIGS. 3a, 3b and 3c show three different assumed field distortions, and their correction.

The local disturbance of the field Bo is assumed to have a trapezoidal shape, as indicated by curve 1 in FIG. 3a. The horizontal coordinate axis is the z axis (its origin lies in the plane of coils 2 to 5), the vertical coordinate axis represents the deviation of the field, normalized to 0.0001 T (Tesla). The deviation of 0.00001 T indicated in FIG. 3 corresponds to the typical field deviation of a few ppm which is generally expected in spectroscopy. By adapting the currents in coils 2 to 5 with a view to minimizing the deviation of the field configuration, curve 2 is obtained. The currents flowing through the individual coils 2 to 5, as indicated in FIG. 2 are equal, for the individual coils, viewed from the outside to the inside, to 26.6 A; −28.6 A; 11.3 A; −0.7 A; a negative sign meaning that the current has a sense opposite to that of a coil for which the current is indicated with a positive sign.

The coil set 2–5 lies on contact with the patient 1. Any movements of the coils caused by the patient's breathing can be accounted for by triggering. The diameters of the individual coils, viewed from the outside to the inside, are equal to approx. 36 cm, 20 cm, 12 cm and 6 cm.

The illustrated embodiment succeeds in reducing the local disturbance of the magnetic field Bo inside the patient, near the surface (the center of deviation being located approx. 5 cm below the surface). The area 10 in the patient's body 1 that gives rise to the local disturbance the magnetic field is indicated by a shaded area in FIG. 2.

Figure 3B:
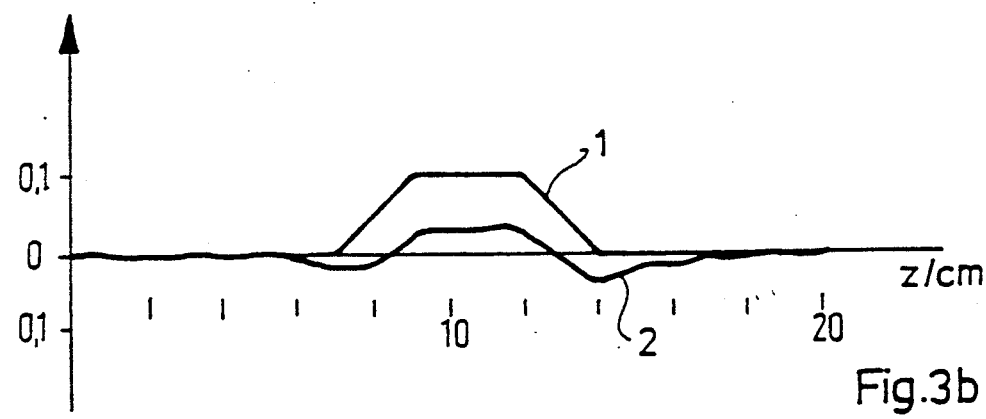

In the case of the example illustrated in FIG. 3b, a local disturbance of the field Bo has been assumed which is likewise located inside a sample. This time, however, the disturbance has a distance from the plane of the coils 2 to 5 of approx. 10 cm. Here again, homogeneity can be notably improved with the aid of the shim coil system comprising the coils 2 to 5, although the deviation is somewhat greater than in the first example (FIG. 3a). In FIGS. 3a and 3b, correction has been effected in such a way that no disturbing distortions of the magnetic field Bo are produced outside the area to be corrected so that it is now possible to spectroscopize patient 1 completely.

Figure 3C:
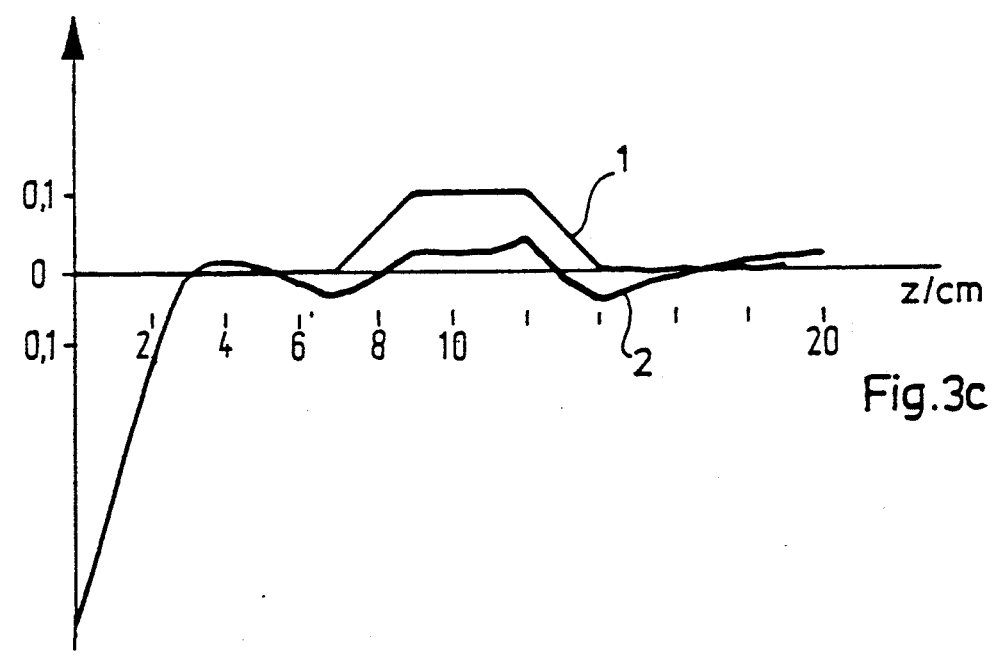

If spectroscopy is to be performed only on a geometrically small portion of the sample, then the optimizing measures can be limited to exactly that portion. The principle is illustrated in FIG. 3c, where the adjustment measures commence only at a value of z equal to 3 cm, the deviation of the field Bo from the homogeneous curve being rather considerable below that point.

Figure 5:
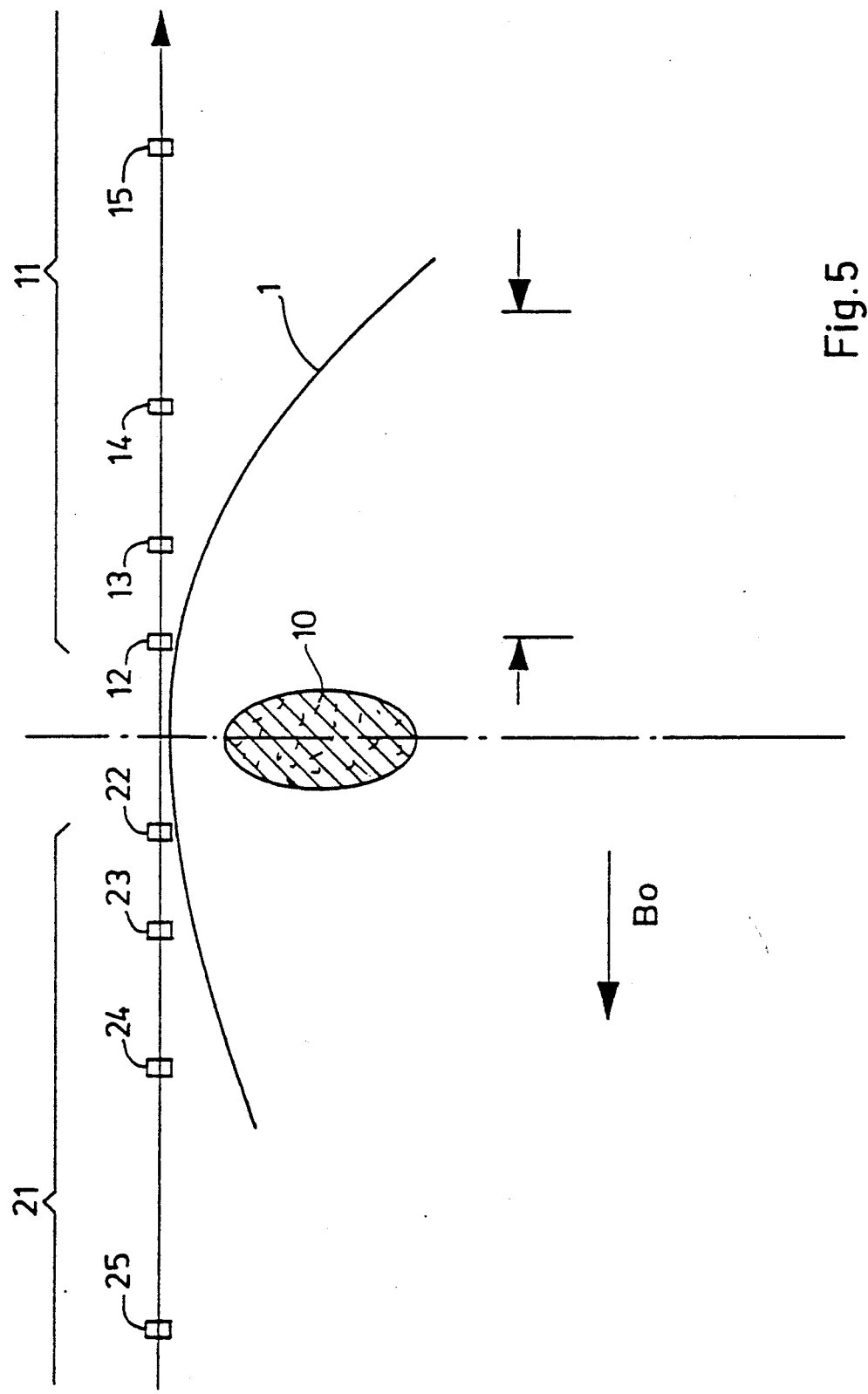
FIG. 5 shows a sectional view of the arrangement of the rectangular coils of FIG. 4, and the currents flowing therethrough.
Figure 6:
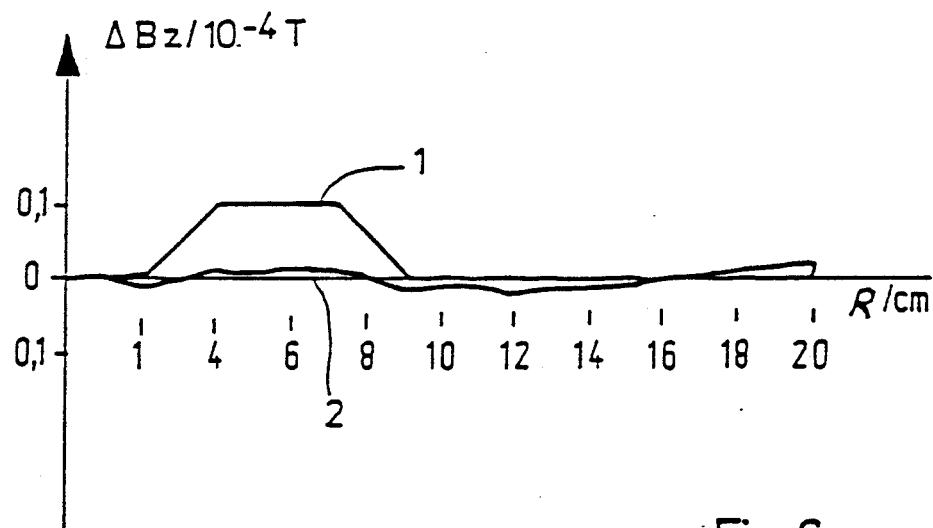
FIG. 6 shows the correction achievable by the rectangular coils.

Referring now to FIGS. 4 to 6, there will be described one embodiment of the invention using rectangular conductor loops. In the case of this embodiment, the longitudinal axis of patient 1 extends in the direction of the magnetic field Bo, a situation which is generally found in a horizontal superconductive magnet. The illustration shows sets 11 and 21 comprising each four concentrical rectangular conductor loops 12 to 15 on the one hand, and 22 to 25 on the other hand, each conductor loop having only a single winding, and the individual sections extending in the direction of the field Bo and the direction of the x axis. In the illustrated embodiment, all of the conductor loops lie in the same plane which extends at a right angle relative to the y axis. The conductor loops are mounted on a common carrier 26 in the form of a plastic plate and are thereby prevented from changing their positions one relative to the other. The currents have been selected in that example in such a way that the immediately neighboring sections of the conductor loops 12 and 22, extending in the x direction, are passed by a current of 3.65 A flowing in the same direction, that the next following sections of the two conductor loops 13 and 23 extending in parallel thereto are passed by an inversely directed, equal current of $-19.7$ A, that the next following sections of the conductor loops 14 and 24 extending in parallel thereto are passed by a current of 19.6 A (in the same direction as the before-mentioned sections of the extremely outer conductor loops), and that the neighboring sections of the innermost conductor loops 15 and 25, extending in the x direction, are passed by a current of 5.9 A. Regarding the correction of field Bo, the only conductor sections of interest are those four straight sections that face each other and that extend in parallel to each other and to the x axis. In fact, FIG. 5 illustrates only these conductors. The four sections of the coil sets or conductor loop sets 11 and 21, that extend in parallel to the x axis and that occupy the extreme left and right positions in FIG. 4, also effect strong variations of the field Bo in their immediate neighborhood, but only slight variations in the area of interest for purposes of this invention, which is found substantially in the area of a plane extending between the two coil sets 11 and 21, in transverse direction to the z axis.

FIG. 6 illustrates by way of example, in the form of curves 1 and 2, how a field deviation in the range of 0.00001 T can be corrected in this case, too. The distance from the plane of sets 11 and 21 has been defined as R, because the correction is effected in radial direction (relative to Bo).

Figure 8:
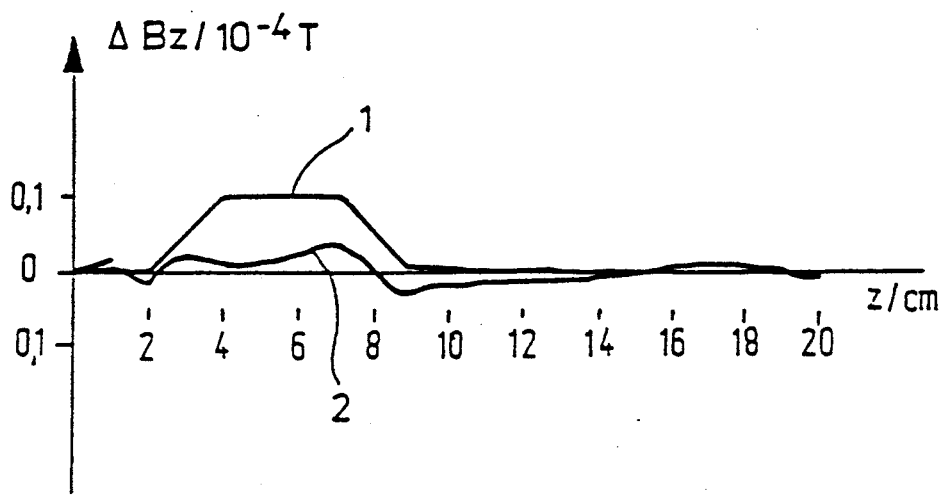
FIG. 8 shows the correction achievable by the coils according to FIG. 7.

The third embodiment of the invention illustrated in FIGS. 7 and 8 demonstrates that there is also the possibility to arrange shim coil sets in several planes. This third embodiment of the invention makes use of two sets 31 and 41 comprising each two concentrical ring coils 32 and 33 on the one hand, and 42 and 43 on the other, the ring coils 32 and 33, consisting each of a single winding, being arranged in concentrical relationship to each other and in a first plane 35 and the ring coils 42 and 43, which likewise consist of a single winding each, being also arranged concentrically relative to each other and in a plane 36 extending in parallel to the plane 35 and in transverse direction to the z axis. All these coils are mounted on a common carrier 44 consisting of a plastic material and comprising two spaced discs 45 which are interconnected by a lateral connecting piece 46 in order to make the space between the disc 45 accessible. If the larger (outer) coil 32 of the coil set 31, which is in direct contact with the patient, carries a current of $-1.54$ A, the inner coil 33 carries a current of 2.63 A, the outer coil 42 of the coil set 41, which is spaced from the patient, carries a current of $-6.54$ A and the inner coil carries a current of $-9.55$ A, then the corrected configuration of the field Bo can be obtained, which is illustrated in FIG. 8 by curve 2, while the noncorrected field configuration is again represented by curve 1. The distance z is measured from the coil set 31 which is in direct contact with the patient 1.

In the case of the second embodiment (FIGS. 4 to 6), the clear distance between the conductor loops 12 and 22 is 6 cm, the clear distance between the conductor loops 13 and 23 is 12 cm, the clear distance between the conductor loops 12 and 24 is 20 cm, the clear distance between the conductor loops 15 and 25 is 36 cm. The lengths of the conductors, in the x direction, and the positions of the extreme right and left conductor sections, viewed in the z direction, must be big relative to the before-mentioned clear distances. While these extensions have been assumed to be infinite in the arithmetic example, their influence may of course be considered in a concrete case.

In the case of the third embodiment (FIG. 7) the dimensions are as follows: the distance between the coil planes 35 and 36 is 6 cm, the diameter of the inner conductor loops 33 and 43 is 6 cm, the diameter of the outer conductor loops 32 and 42 is 12 cm.

In the case of the second embodiment (FIGS. 4 to 6), the extreme outer conductor loops or coils 12, 22 are passed by oppositely directed currents of equal amount, and the other coils, too, are passed by currents of respectively equal amounts flowing in opposite directions. In addition, all coils are equally sized. In the case of this example it may happen when carrying out gradient switching that when the different coils which are passed by oppositely directed currents of equal amounts, are interconnected and connected to a single current source, the potentials generated by the of gradient switching may cancel out each other so that no current variations occur in the coils. This effect will not, with a high degree of probability, occur in the first and the third embodiments of the invention. There is, therefore, the possibility, if this should be deemed necessary, to arrange additional coils of equal size as the coils arranged in the direct neighborhood of the patient at a relatively large distance from the patient. The additional coils must have such an orientation and must be connected to the coils arranged near the patient such that the potentials generated by the of gradient switching will cancel out each other.

The additional coils do not, in this arrangement, contribute to varying the field Bo inside the patient. It is understood that, if desired, these additional coils may also be applied directly on those parts of the patient's bodies which are of no interest for the particular examination being carried out.

Generally, it is possible to replace current-carrying conductor loops by magnetic bodies of equal outer dimensions as the conductor loop to be replaced. Consequently, another embodiment of the invention provides that part of the electric conductors be replaced or supplemented by passive paramagnetic, ferromagnetic or else diamagnetic correction elements. The sizes of the correction elements are determined by analogy to the determination of the conductor loops in the preceding examples, or by any other of the known arithmetic methods.

Figure 9:
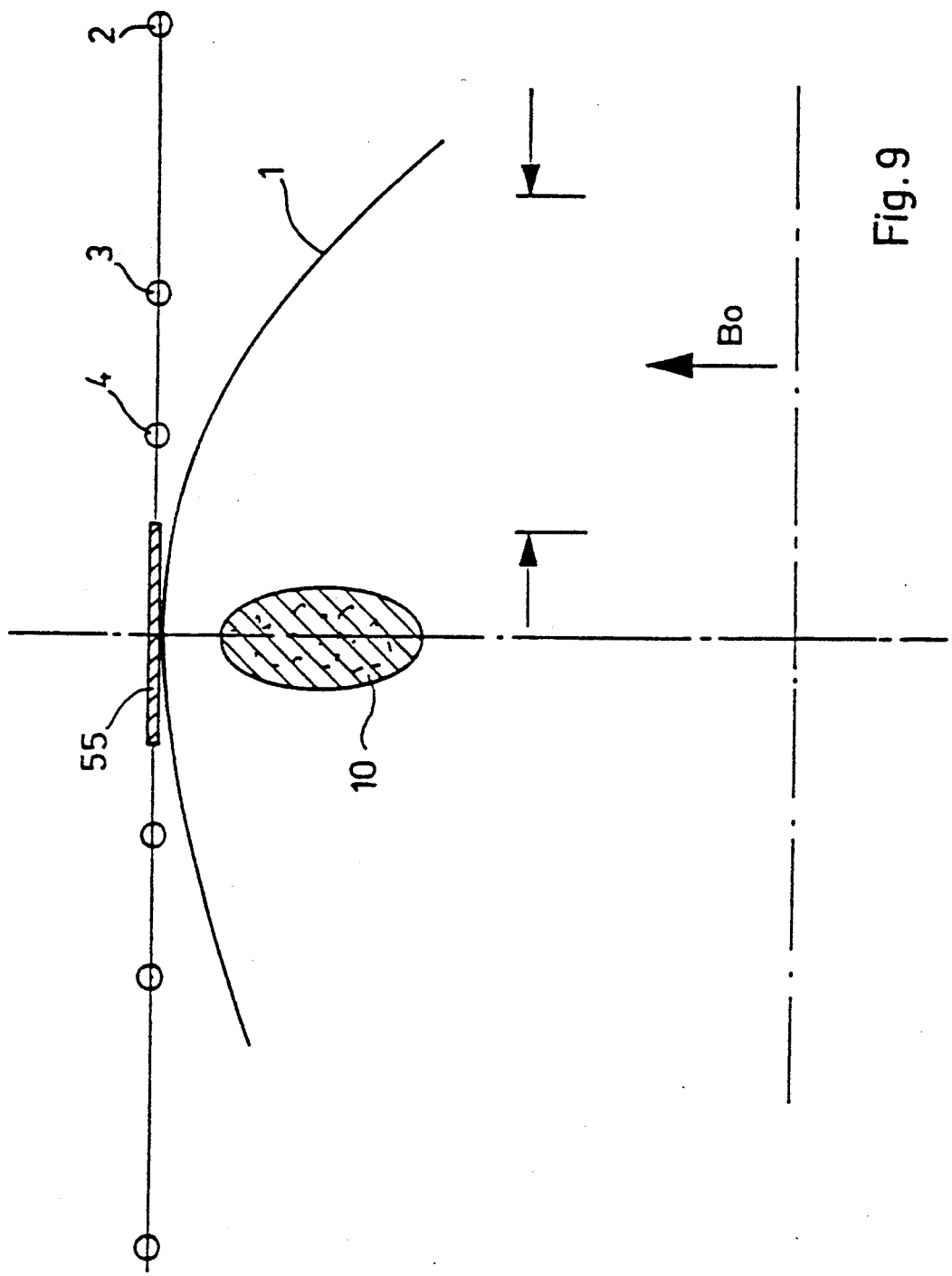
FIG. 9 shows a modification of the arrangement illustrated in FIG. 2, using a paramagnetic shim element.

In FIG. 9, the extreme inner conductor loop 5 of the example shown in FIG. 2 has been replaced by a paramagnetic circular disc 55 having a diameter of 6 cm and a thickness of 1 mm. Its magnetization is equal to $3.65 \times 10^3$ A/m. The correction effect obtained by this arrangement corresponds exactly to that of the example illustrated in FIG. 3a.

Figure 10:
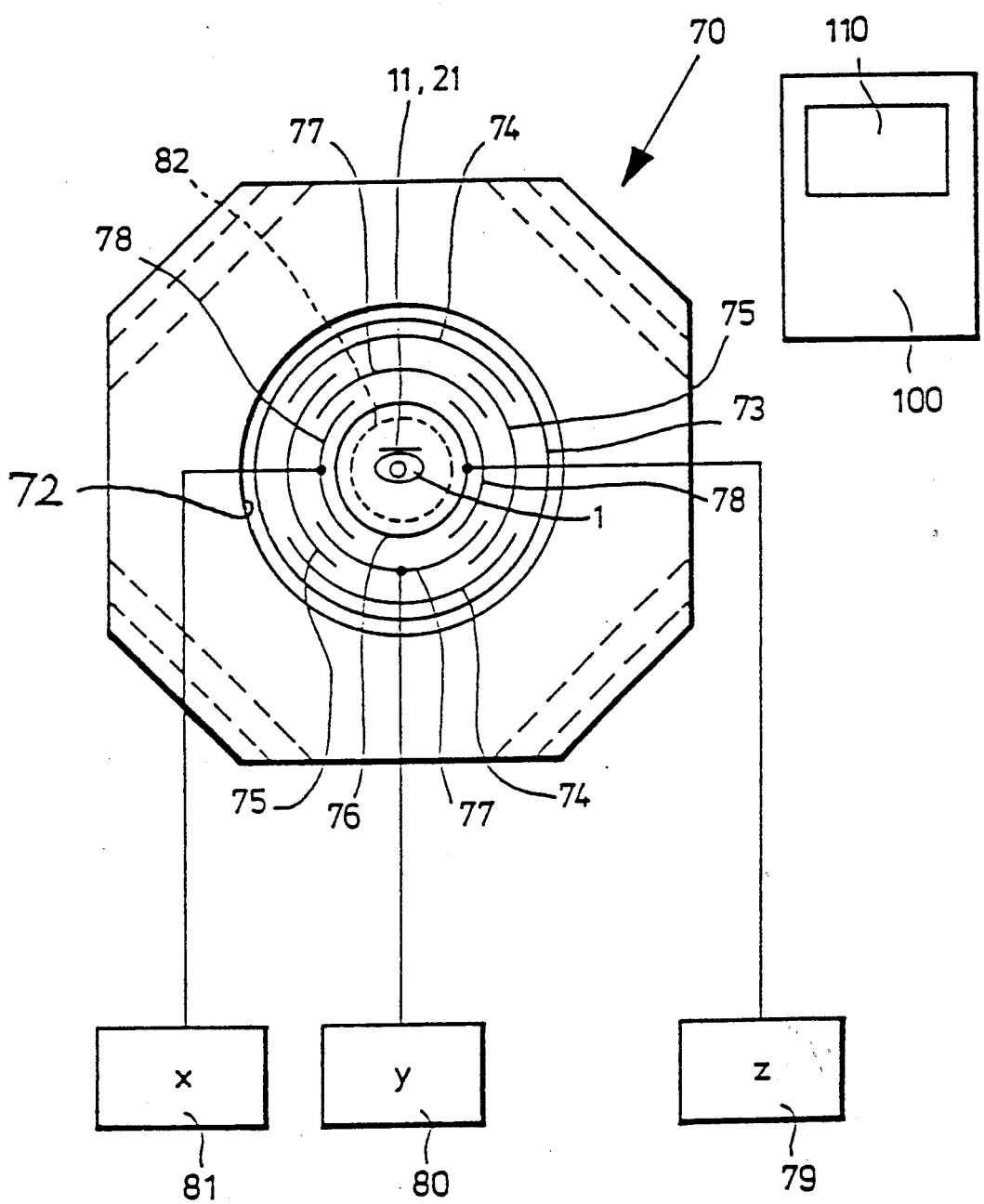
FIG. 10 is a diagrammatic representation of a nuclear spin tomograph.

FIG. 10 shows, in a very simplified representation, a nuclear spin tomograph comprising a main magnet 70 with a bore 72 into which a sample 1, preferably a biological sample, for example a patient, can be introduced. Further one can see in this illustration the shim coils 73, 74, 75 normally present in a conventional nuclear spin tomograph, which are required for correcting the field Bo and which, in the absence of a sample, produce a field Bo as homogeneous as possible, and further gradient coils 76, 77 and 78 which are connected to gradient power supply units 79, 80 and 81, respectively. The sample 1 is contacted by the additional shim coil sets 11 and 21 illustrated in FIG. 4. Sample 1, together with the shim coil sets 11 and 21, is located inside a sample head 87, for irradiating rf pulses into the sample and for receiving the radio frequency produced by the nuclear spins of the sample. A computer 100 then processes the signals received from the sample and displays the result on an output unit 110 (display).

The reference numerals inserted in the claims are not meant to restrict the invention, but only to facilitate its understanding.

We claim:

1. Nuclear magnetic resonance spectrometer for investigating biological sample in a volume under examination, said nuclear magnetic resonance spectrometer comprising:

magnetic coil means for generating a substantially homogeneous magnetic field in the volume under examination;

shim coil means for eliminating local inhomogeneities of the substantially homogeneous field; and additional electric conductor means, configured and disposed in the volume under examination proximate a sample, for generating an inhomogeneous magnetic field in response to current passing therethrough, in order to at least partially eliminate the local inhomogeneities in a selected area in the sample.

2. Nuclear magnetic resonance spectrometer according to claim 1, wherein the additional conductor means is disposed at a position in which the additional conductor means will not disturb movement of the sample into and out of the volume under examination of the nuclear magnetic resonance spectrometer.

3. Nuclear magnetic resonance spectrometer according to claim 2, wherein the additional conductor means is removable from the volume under examination.

4. Nuclear magnetic resonance spectrometer according to claim 1, wherein the additional conductor means comprises a flat coil.

5. Nuclear magnetic resonance spectrometer according to claim 4, wherein the additional conductor means comprises a plurality of flat coils of different dimensions, with the flat coils nested in one another.

6. Nuclear magnetic resonance spectrometer according to claim 1, wherein the additional conductor means comprises a plurality of shim coils disposed in a spaced apart arrangement and substantially in a single plane.

7. Nuclear magnetic resonance spectrometer according to claim 5, wherein the plurality of flat coil is disposed in a spaced apart arrangement, and substantially in a single plane.

8. Nuclear magnetic resonance spectrometer according to claim 1, wherein the additional conductor means comprises a plurality of shim coils disposed in a substantially parallel and coaxial arrangement, at a certain spacing in the direction of their axes.

9. Nuclear magnetic resonance spectrometer according to claim 5, wherein the additional conductor means comprises a plurality of coil sets disposed in a substantially parallel and coaxial arrangement, at a certain spacing in the direction of their axes.

10. Nuclear magnetic resonance spectrometer according to claim 1, further comprising at least one local shim element capable of being magnetized, said local shim element being disposed proximate the sample.

11. Nuclear magnetic resonance spectrometer according to claim 1, further comprising nuclear interferography means for detecting field inhomogeneities due to susceptibility variation.

12. Nuclear magnetic resonance spectrometer according to claim 1, wherein the additional conductor means comprises at least two electric conductors designed, arranged and interconnected in such a way that any variation of the current carried by them, due to induction resulting from the switching of gradients, is largely prevented, and at least one of the said electric conductors is disposed proximate the sample.

13. Nuclear magnetic resonance spectrometer according to claim 1, further comprising power supply means for supplying the additional conductor means with a d.c. current of adjustable magnitude.

14. Nuclear magnetic resonance spectrometer according to claim 1 further comprising a sample head, said additional conductor means being disposed inside said sample head.

* * * * *